(12) United States Patent
Donoghue et al.

(10) Patent No.: US 10,636,969 B2
(45) Date of Patent: Apr. 28, 2020

(54) APPARATUS AND METHOD OF DIRECTLY PATTERNING HIGH RESOLUTION ACTIVE MATRIX ORGANIC LIGHT EMITTING DIODES USING HIGH-RESOLUTION SHADOW MASK

(71) Applicant: eMagin Corporation, Hopewell Junction, NY (US)

(72) Inventors: Evan P. Donoghue, Hopewell Junction, NY (US); Kerry Tice, Hopewell Junction, NY (US); Ilyas I. Khayrullin, Hopewell Junction, NY (US); Fridrich Vazan, Pittsford, NY (US); Tariq Ali, Hopewell Junction, NY (US); Laurie Sziklas, Hopewell Junction, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/968,606

(22) Filed: May 1, 2018

(65) Prior Publication Data
US 2018/0315926 A1 Nov. 1, 2018

Related U.S. Application Data

(60) Provisional application No. 62/492,786, filed on May 1, 2017.

(51) Int. Cl.
*H01L 51/00* (2006.01)
*H01L 27/32* (2006.01)
(Continued)

(52) U.S. Cl.
CPC ...... *H01L 51/0012* (2013.01); *H01L 27/3244* (2013.01); *H01L 51/001* (2013.01);
(Continued)

(58) Field of Classification Search
CPC ............. H01L 51/0012; H01L 51/0011; H01L 2227/323; H01L 51/56; H01L 51/001;
(Continued)

(56) References Cited

U.S. PATENT DOCUMENTS

2017/0132976 A1* 5/2017 Yang .................... G09G 3/2003
2017/0179438 A1* 6/2017 Xu ...................... H01L 27/3213

* cited by examiner

*Primary Examiner* — Jasmine J Clark
(74) *Attorney, Agent, or Firm* — Kaplan Breyer Schwarz, LLP

(57) ABSTRACT

An apparatus and method for performing material deposition on an active-matrix organic light emitting diode (AMOLED) display array on a substrate, includes aligning a shadow mask to a first position relative to the substrate; initially depositing a first material through the shadow mask onto the substrate at a first material deposition position relative to the first position of the aligned shadow mask and at a first deposition height; incrementing the position the shadow mask to a second position relative to the first material deposition position; and subsequently depositing one of the first material or a second material through the shadow mask onto the substrate at a second material deposition position relative to the first material deposition position, wherein the second material deposition position having an identical deposition pattern as the first material deposition position on account of the shadow mask.

20 Claims, 13 Drawing Sheets

(51) Int. Cl.
*H01L 51/56* (2006.01)
*H01L 51/50* (2006.01)

(52) U.S. Cl.
CPC ...... *H01L 51/0011* (2013.01); *H01L 51/5036* (2013.01); *H01L 51/56* (2013.01); *H01L 27/322* (2013.01); *H01L 27/3211* (2013.01); *H01L 51/504* (2013.01); *H01L 2227/323* (2013.01)

(58) Field of Classification Search
CPC ............. H01L 51/5036; H01L 27/3244; H01L 51/504; H01L 27/322; H01L 27/3211
See application file for complete search history.

APPARATUS AND METHOD OF DIRECTLY PATTERNING HIGH RESOLUTION ACTIVE MATRIX ORGANIC LIGHT EMITTING DIODES USING HIGH-RESOLUTION SHADOW MASK

RELATED APPLICATION INFORMATION

This application claims benefit to and priority from U.S. Provisional Patent Application No. 62/492,786, filed May 1, 2017, of which the entire contents of are hereby incorporated by reference herein.

FIELD OF DISCLOSURE

The present disclosure generally relates to methods for making one or more organic light-emitting diode (OLED) emitter layers. More particularly, the present disclosure relates to direct patterning of one or more OLED layers using shadow masks.

BACKGROUND

The OLED diode structure was discovered in 1987 and has been developed into a technology that is used for displays in cellphones, microdisplays and televisions. Microdisplays are small displays that are used under magnification or for projection applications. Some of the applications of microdisplays are camera viewfinders and wearable displays, specifically for professions that require hands free information or for virtual reality applications.

One feature that differentiates microdisplays from normal displays is that the pixel density of microdisplays is much greater than normal displays. An example of normal displays with high pixel densities are the displays on the Samsung Galaxy S4 and the HTC One with 441 and 468 pixels per inch (PPI), respectively. Pixel densities on some microdisplays such as eMagin™ SXGA and Holoeye™ HED 6001 have 2646 and 3175 PPI, respectively, about an order of magnitude higher in PPI than normal displays.

Most microdisplays are fabricated on single crystal silicon substrates using CMOS technology. For most microdisplays, liquid crystals (LC) with backlighting are used, but a growing segment of microdisplays are based on organic light emitting diodes (OLEDs). OLED microdisplays have a few advantages over LC microdisplays: OLED is intrinsically simpler in design, does not need backlighting, has a higher viewing angle, faster response time, higher contrast, and it has a higher temperature operating range.

A full color (i.e. RGB colors) OLED display requires patterning to place individual color OLED stacks onto its respective color sub-pixels. Conventional patterning using lithography is not possible with organics due to the sensitivity of the organics to photoresist and chemistries, which is required for photoresist processing. There are few methods to pattern organics other than photoresist such as metal shadow mask, organic vapor jet deposition, and thermal dye transfer. All commercial high resolution full color OLED displays are made using shadow mask patterning in which fine metal masks (FMM) are used.

Current methods produce color emitter layers with a metal shadow mask, which suffers from resolution issues and may prevent color emitter sub-pixel sizes under 10 microns. Other methods create high-resolution OLED micro-display RGB sub-pixels using a white OLED overlaid with a color filter. The color filters may absorb approximately 80% of the white light and reduce light output from the OLED.

FIG. 1 illustrates a schematic structure of typical OLED with patterned anode and un-patterned organic layers, cathode and thin film encapsulation with red, green and blue color filters. Such a conventional OLED structure includes one or more anodes disposed on a silicon backplane substrate, where deposited on the one or more anodes are: a hole injection layer, a hole transport layer, at least one organic light-emitting layer (e.g., blue-green EML and red-orange EML layers), an electron transport layer, a cathode, a thin film encapsulation layer, and at least one color filter (e.g., red, green, and blue CF layers) disposed on the thin film encapsulation layer. Top emitting active matrix organic light emitting diode (AMOLED) displays require an anode to inject charges (holes) into subsequently deposited organic layers in a structure as indicated in FIG. 1. This anode is typically composed of a highly reflective metal with an appropriate work function that matches with the energy levels of the hole injection layer for efficient charge injection. In an active matrix display, this anode must be patterned on top of the backplane, typically using lithography or an etch process to define the subpixel. For AMOLED microdisplays, these pixels can be <10 microns in size so a micron scale patterning technique is required. Defining the anode pixel array with existing shadow mask technology is not possible for small pixels (<10 micron) as the state-of-the-art fine metal masks are not flat enough or to accurately define <10-micron feature sizes.

The processing required to pattern these layers through photolithography or etches poses several problems. First, it introduces additional process steps and complexity, requiring multiple tools to deposit and pattern the metal. These process steps increase the tact time required per display and introduce additional cost for materials and equipment. Second, the processing required to pattern the deposited metal modifies its surface as an undesired by-product of the patterning process, changing its reflectivity, resistivity and work function and thus its performance as an anode in OLEDs. As these steps typically occur in air, surface oxides may also form. These issues preclude the use of many materials, require careful tailoring of the anode to withstand processing, and frequently require additional processing steps to treat the surface after patterning. Finally, these additional steps as well as the act of removing metal can frequently leave residual metal, particles or residues which may introduce defects and reduce yield or require additional steps to attempt to eliminate these defects. For all these reasons, existing anode patterning techniques are sufficient but non-satisfactory for defining the anode pixel array.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a method for performing material deposition on an active-matrix organic light emitting diode (AMOLED) display array on a substrate, may comprise aligning a shadow mask to a first position relative to the substrate, the first position corresponding to a first sub-pixel of an AMOLED display pixel, initially depositing a first material through the shadow mask onto the substrate at a first material deposition position relative to the first position of the aligned shadow mask and at a first deposition height. The method may further include incrementing the position of the shadow mask to a second position relative to the first material deposition position, the second position corresponding to a second corresponding sub-pixel of the AMOLED display pixel, and subsequently depositing one of the first material or a second material through the shadow mask onto the substrate at a second material deposition position relative to the first material deposition position.

The method may further include re-aligning the shadow mask to the first position and depositing a third material through the shadow mask on top of the first material, re-aligning the shadow mask to the second position and depositing a fourth material through the shadow mask on top of the second material, re-aligning the shadow mask to the first position and depositing a fifth material through the shadow mask on top of the third material, and re-aligning the shadow mask to the second position and depositing a sixth material through the shadow mask on top of the forth material, wherein each subsequent material deposition position having an identical deposition pattern as the first material deposition position on account of the shadow mask.

In another embodiment disclosed herein, an apparatus fabricated by the above method may comprise an AMOLED array comprising a plurality of pixels, wherein each pixel comprises: a metal anode layer having at least a first anode comprising a first metal material at a first anode material height; and an organic light emitter layer having at least a first single-color light emitter element comprising a first organic material at a first light emitter material height. The AMOLED array may further comprise the metal anode layer including a second anode comprising the first metal material at a second anode material height, the second anode material height being different from the first anode material height, and the second anode having an identical deposition pattern as the first anode.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 4 illustrates positioning a representative portion of a shadow mask having an aperture over a first deposition position of a representative portion of a substrate;

FIG. 5 illustrates depositing a first material through the aperture of the representative portion of the shadow mask at the first deposition position of the representative portion of the substrate to a first height;

FIG. 6 illustrates positioning a representative portion of the shadow mask having the same aperture over a second deposition position of the representative portion of a substrate;

FIG. 7 illustrates depositing either the first material, or in the alternative, a second material through the aperture of the representative portion of the shadow mask at the second deposition position of the representative portion of the substrate to the same first height;

FIG. 8 presents an alternative embodiment to FIG. 7 that illustrates depositing either the first material, or in the alternative, the second material through the aperture of the representative portion of the shadow mask at the second deposition position of the representative portion of the substrate to a different second height than the first height;

FIG. 9 illustrates positioning a representative portion of a shadow mask having an aperture over a first deposition position of a representative portion of one of 1) the inorganic metal anode material, 2) the organic OLED material, or 3) the metal cathode material at the first deposition position;

FIG. 10 illustrates depositing a first material through the aperture of the representative portion of the shadow mask at the first deposition position of the representative portion of one of 1) the inorganic metal anode material, 2) the organic OLED material, or 3) the metal cathode material at the first deposition position to a first height;

FIG. 11 illustrates positioning a representative portion of the shadow mask having the same aperture over a second deposition position of the representative portion of one of 1) the inorganic metal anode material, 2) the organic OLED material, or 3) the metal cathode material at the second deposition position;

FIG. 12 illustrates depositing either the first material, or in the alternative, a second material through the aperture of the representative portion of the shadow mask at the second deposition position of the representative portion of one of 1) the inorganic metal anode material, 2) the organic OLED material, or 3) the metal cathode material to the same first height; and FIG. 13 presents an alternative embodiment to FIG. 12 that illustrates depositing either the first material, or in the alternative, the second material through the aperture of the representative portion of the shadow mask at the second deposition position of the representative portion of one of 1) the inorganic metal anode material, 2) the organic OLED material, or 3) the metal cathode material to a different second height than the first height.

DETAILED DESCRIPTION

Figure 1:
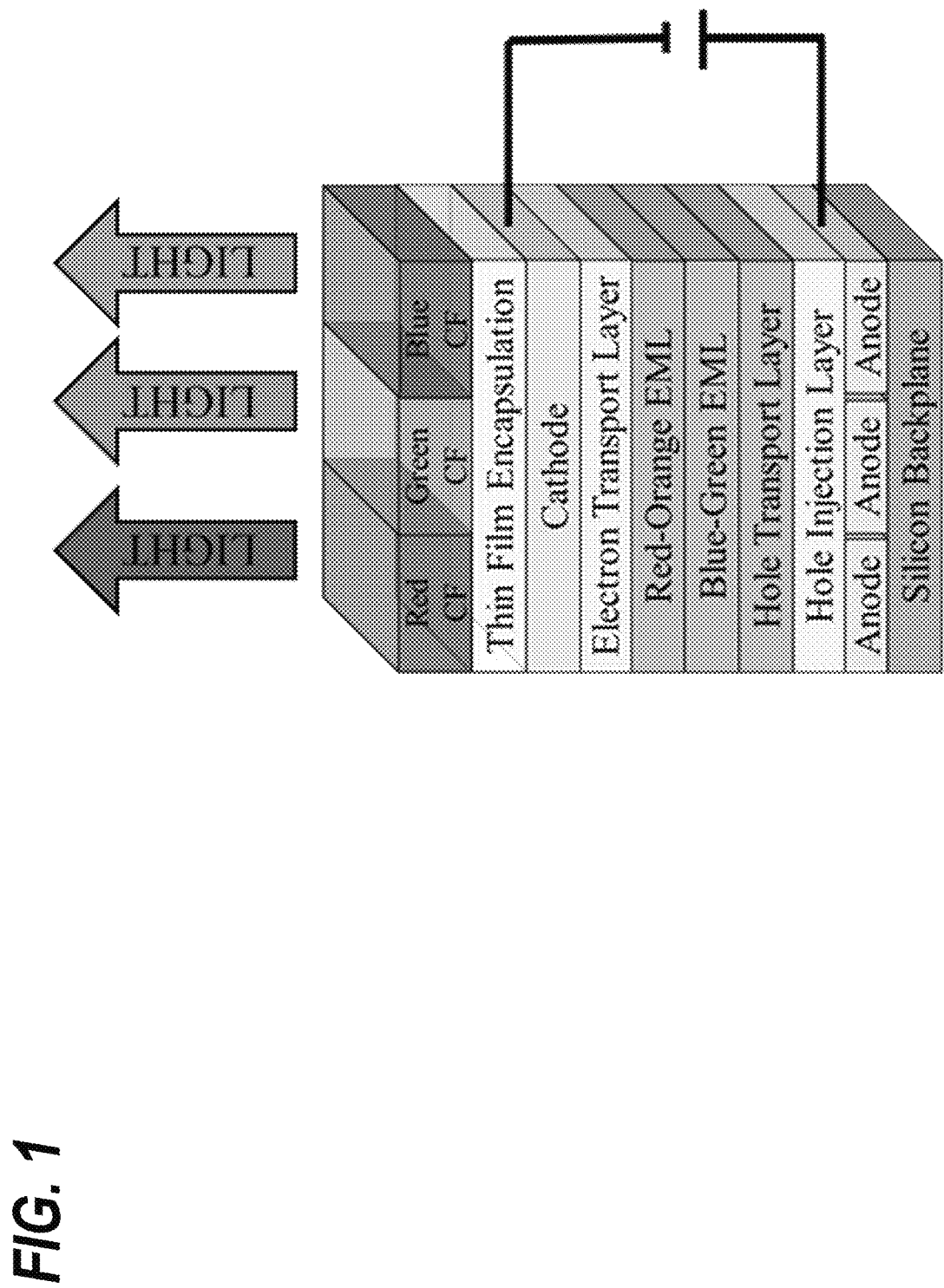
FIG. 1 illustrates a schematic structure of typical OLED with patterned anode and un-patterned organic layers, cathode and thin film encapsulation with red, green and blue color filter.
Figure 2:
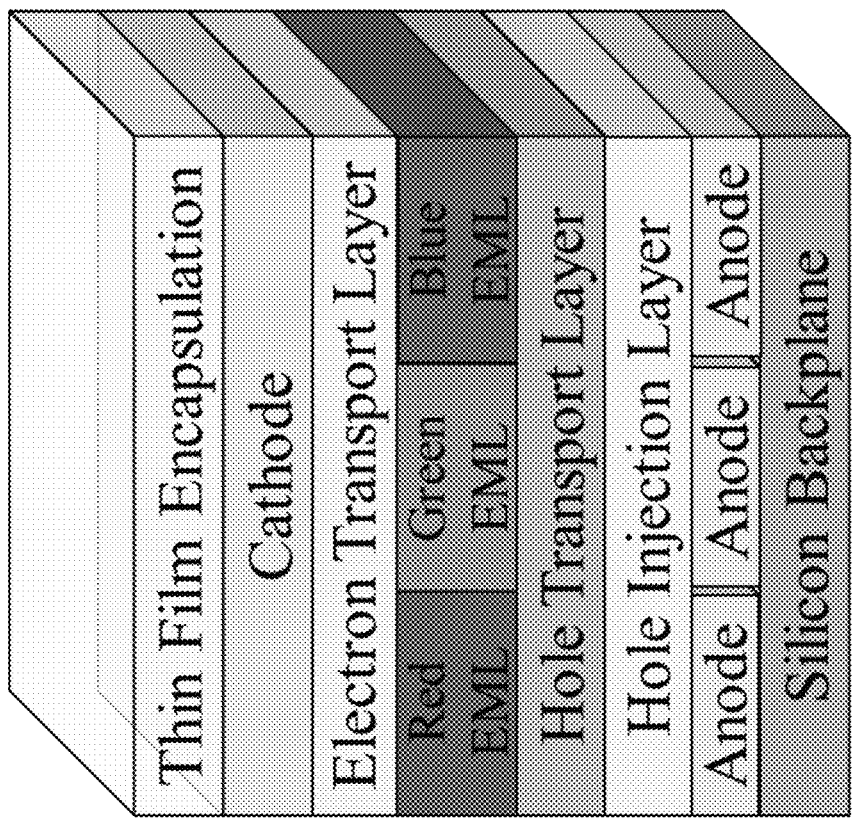
FIG. 2 illustrates a schematic of an AMOLED display on CMOS silicon backplane with directly patterned anode and emitter layers with the remainder of the layers un-patterned.

The present disclosure provides methods for making color OLED emitters pixels, (e.g., patterned structures of one or more color emitter materials), via the use of a shadow mask of free-standing silicon nitride membrane to pattern color emitter materials, anode and cathode layers and color wavelength modifier layers. FIG. 2 depicts an exemplary layer structure for an OLED in accordance with the present disclosure, where the layer structure includes a layer structure deposited on one or more anodes disposed on a substrate, the layer structure including a hole injection layer, a hole transport layer, a layer comprising one or more regions of color-emitting material (e.g., red, green, and blue EML regions), an electron transport layer, a cathode, and a thin film encapsulation layer.

An illustrative method is disclosed herein that uses a high-resolution shadow mask, (frequently made from silicon nitride), to define the pixel array in situ in the same tool in which the OLED may be fabricated so that no additional processing or exposure to atmosphere may be required. In such a tool, the substrate—or active matrix backplane—may be fabricated either at a foundry or in previous processing steps and then transferred into a vacuum deposition tool. This substrate and a high-resolution mask are then transferred to a metals deposition chamber which consists of either one or a plurality of metal evaporation sources (such as thermal evaporators, e-beam evaporators or other line-of-sight deposition techniques), shutters or methods of blocking deposition, a stage or chuck for holding the high-resolution mask, a stage or chuck for holding the active matrix substrate, and a high precision optical alignment system. The high-resolution shadow mask and substrate are brought into close proximity with each other (<50 microns) and aligned such that the openings in the shadow mask line up with a set of the thru-silicon vias (or other contacts to the CMOS backplane) and, once satisfactorily aligned, the shutter may be opened or source scanned under the mask to deposit either one or a plurality of metals that define the anode. This process may be stepped and repeated multiple times across the substrate to define the pixel array. As the process is repeated, either the same or different materials may be used in different regions of the display (i.e., each color channel), and the same or different materials may be deposited at differing heights or thickness with respect to adjacent deposited features.

This offers several advantages. First, the process complexity may be reduced as the metal layer may be directly patterned and does not require any metal removal by lift-off or etch processes. Second, the metal may be patterned under vacuum and does not need to be exposed to atmosphere, chemicals or etchants. As a result, the top surface of the patterned anode remains pristine and as-deposited which can improve injection properties and enable the use of a wider range of metals as anode materials than possible with traditional anode patterning techniques (i.e. easily oxidized metals). Finally, by allowing the deposition of different metals in different regions of the display, this technique enables the use of separate anodes tailored specifically for the red, green and blue OLED channels which can improve device efficiency and is not readily achievable using conventional patterning techniques.

Following the definition of the pixel array under vacuum, the wafer may be transferred under vacuum to subsequent chambers in which the metal can be treated, (i.e., oxygen plasma ash), or the remainder of the OLED stack can be formed using either patterned or un-patterned organic layers to build the OLED as in FIG. 2. A similar high-resolution shadow mask and alignment system as described above can be used to deposit any or all the remaining organic layers. Thus, the directly patterned OLED stack can be customized and optimized for each individual color to enable the development of more efficient OLED stacks.

The illustrative embodiment disclosed herein allow for the deposition of the entire OLED stack from anode to cathode to be patterned and deposited in a single tool (or even a single chamber) without exposing any of the layers to air, chemicals or etches. By using high resolution shadow masks, the entire OLED stack can be customized and tailored for each individual color channel to improve device efficiency.

It is important to note that while the discussion here is for patterned anode materials, the OLED can be inverted, and the same concepts would apply for cathode (electron injecting) materials.

Figure 3:
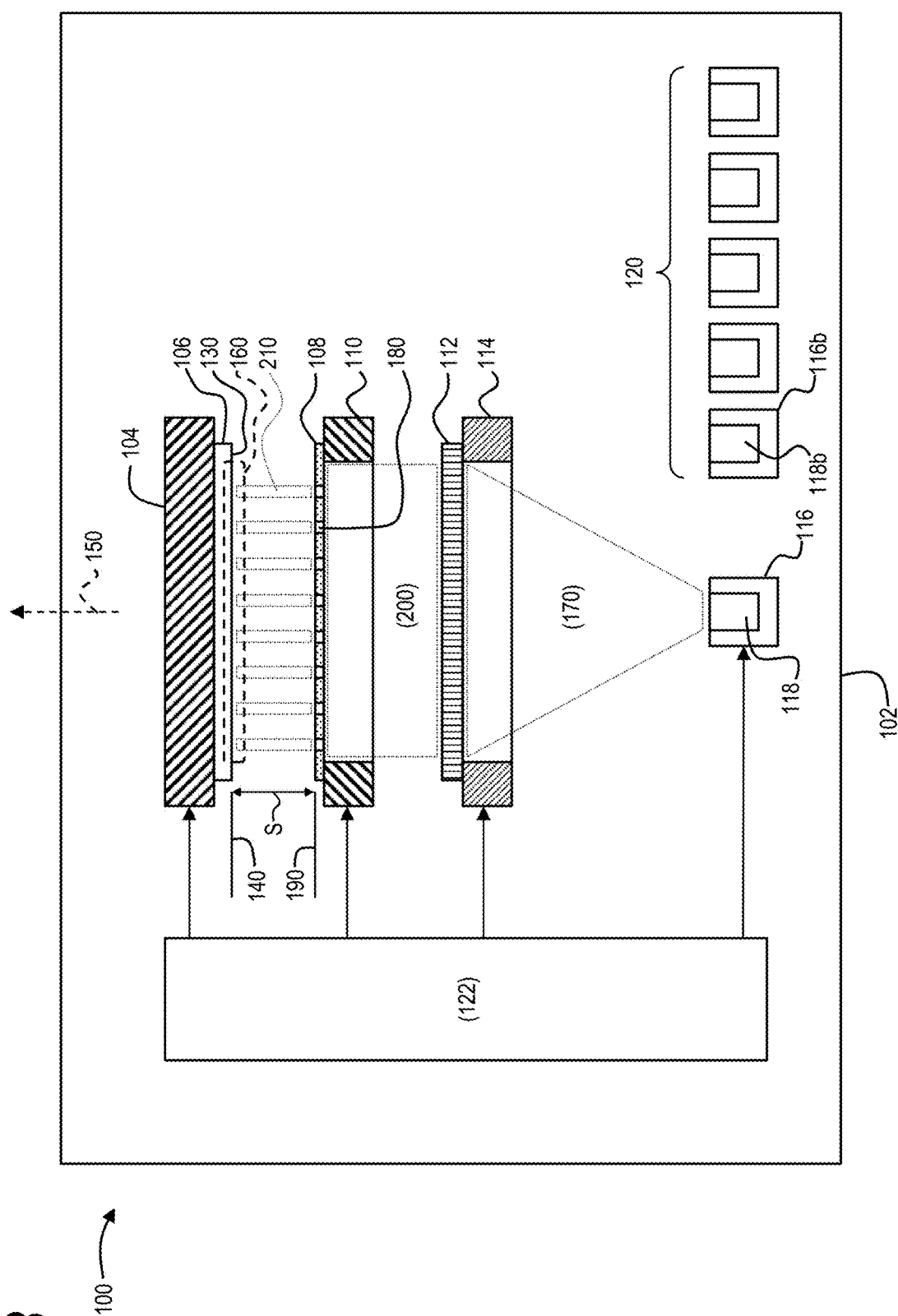
FIG. 3 illustrates depicts a schematic drawing of a cross-section of a high-precision, direct-patterning deposition system in accordance with an illustrative embodiment of the present invention.

FIG. 3 depicts a schematic drawing of a cross-section of the salient features of a high-precision, direct-patterning deposition system in accordance with an illustrative embodiment of the present invention. System 100 includes vacuum chamber 102, a substrate chuck 104 configured to hold a substrate 106, a shadow mask 108 and a shadow mask chuck 110, a collimator 112 and a collimator chuck 114, one source 116 having a corresponding source material 118 of a plurality of sources 120, and a positioning system 122.

System 100 is operative for evaporating a desired pattern of material onto a substrate surface without the need for subsequent subtractive patterning operations, such as photolithography and etching.

System 100 is described herein with respect to the deposition of a pattern of light-emitting material on a glass substrate as part of the fabrication of an AMOLED display. However, it will be clear to one skilled in the art, after reading this Specification, that the present invention can be directed toward the formation of directly patterned layers of virtually any thin-film and thick-film material (organic or inorganic) on any of a wide range of substrates, such as semiconductor substrates (e.g., silicon, silicon carbide, germanium, etc.), ceramic substrates, metal substrates, plastic substrates, and the like. Further, although the illustrative embodiment may be a thermal evaporation system, one skilled in the art will recognize, after reading this Specification, that the present invention can be directed toward virtually any material-deposition process, such as e-beam evaporation, sputtering, and the like. Still further, although the depicted example may be a deposition system suitable for use in single-substrate planar processing, the present invention may be also suitable for use in other fabrication approaches, such as cluster-tool processing, track processing, roll-to-roll processing, reel-to-reel processing, etc. As a result, the illustrative embodiments presented herein may be suitable for use in myriad applications including, without limitation, packaging applications, IC fabrication, MEMS fabrication, nanotechnology device fabrication, ball-grid array (BGA) fabrication, and the like.

Vacuum chamber 102 may be a conventional pressure vessel operative for providing a low-pressure atmosphere that supports evaporation of material 118. It should be noted that vacuum chamber 102 can be a standalone unit, part of a cluster deposition system, or part of a track-deposition system where multiple evaporation chambers are arranged in linear chain. In some embodiments, vacuum chamber 102 includes several evaporation sources 120 and/or shadow mask 108 combinations that enable formation of different patterns of different materials, such as, for example, multiple light-emitting subpixels that emit light at different colors (e.g., red, green, and blue).

Source 116 may be a crucible for vaporizing material 118, which may be centered with respect to substrate 106 and material 118 may be an inorganic or organic material. When material 118 melts or sublimes within the low-pressure atmosphere of the vacuum chamber 102, source 116 ejects vaporized atoms 170 that propagate outward from the source in substantially ballistic fashion toward substrate 106. The vaporized atoms ejected by source 116 collectively define vapor plume 170.

Collimator 112 supported by collimator chuck 114 may be a mechanically robust plate comprising a plurality of channels that are separated by thin walls. Collimator 112 may be dimensioned and arranged to function as a spatial filter that selectively passes vaporized atoms propagating along directions that are nearly normal to plane 150 (i.e., that have very small propagation angles). Collimator 112, therefore, mitigates feathering of deposition material across the entirety of substrate 106. Collimator chuck 114 may be an annular clamping mechanism for holding and locating the collimator relative to shadow mask 108.

Shadow mask 108 may be a plate of structural material that includes a plurality of apertures 180. Shadow mask 108 may be substantially flat and defines plane 190. The shadow mask 108 may be located between source 116 and substrate 106 such that it blocks the passage of all vaporized atoms from the source 116 except those that pass through its apertures 180. The shadow mask 108 and substrate 106 are separated by separation, S, (typically a few tens or hundreds of microns), where planes 140 and 190 are substantially parallel, and apertures 180 are aligned with deposition sites on the surface 130 of the substrate 106.

Shadow mask chuck 110 may be a mechanical clamp that locates shadow mask 108 between source 116 and substrate 106. In some embodiments, mask chuck 110 may be an electrostatic chuck that analogous to substrate chuck 104. Typically, shadow mask 108 may be supported only around its perimeter. In some embodiments, mask chuck 110 may include a slight curvature (e.g., an upward slope) that biases the shadow mask 108 in an upward direction to counteract shadow-mask sag due to gravity. In some embodiments, a fine support structure may extend across the opening in mask chuck 110 to support the mask and reduce the gravitational sag.

Substrate 106 may be a glass substrate suitable for the formation of active-matrix organic-light-emitting-diode (AMOLED) displays. Substrate 106 includes surface 130, which defines plane 140 and normal axis 150. Normal axis 150 is orthogonal to plane 140. Surface 130 includes a plurality of deposition sites in a deposition zone 160 for receiving inorganic metal anode material, organic OLED material, inorganic metal cathode material and/or color wavelength modification material. The deposition sites are arranged in a plurality of pixel regions such that each pixel region includes one deposition site for the light-emitting material of each color.

Substrate chuck 104 may be a platen for securing substrate 106 such that the substrate is very flat. Substrate chuck 104 may be dimensioned and arranged to contact substrate 106 only from one side (either the frontside or the backside) to mitigate interference with the deposition of material on the other side of the substrate. In the depicted example, substrate chuck 104 may be an electrostatic chuck that applies a voltage across a dielectric to electrostatically "clamp" substrate 106 securely in place. In some embodiments, substrate chuck 104 secures the substrate via a different means, such as vacuum, mechanical clamps, from both sides of the substrate, etc. In some embodiments, substrate chuck 104 includes in-situ gap sensors that operate, with positioning system 122 to control the spacing and degree of parallelism between substrate 106 and shadow mask 108.

Positioning system 122 may be a system for controlling the relative positions of substrate 106, the source 116, the shadow mask 108, and the collimator 112. The positioning system 122 includes three six-axis manipulators and an optical alignment system to control the alignment between the substrate 106 and the shadow mask 108. Each of the six-axis manipulators may be operatively connected with each of substrate chuck 104, the shadow mask chuck 110, the collimator chuck 114 and the source(s) 116 and 120 to control its position along and rotation about each of x-, y-, and z-axes. In some embodiments, the position of at least one of shadow mask chuck 110 and collimator chuck 114 is not controlled by a six-axis positioner. In some embodiments, positioning system 122 also includes a rotation stage for controlling the relative rotational alignment of substrate 106 and shadow mask 108.

FIGS. 4-8 illustrate one method for depositing a directly patterned layer of material on a substrate in accordance with the illustrative embodiment.

A first illustrative method includes mounting the shadow mask 108 to the mask chuck 110 and mounting the substrate 106 in substrate chuck 104. The positioning system 122 then controls the relative positions of the substrate 106, the shadow mask 108, and the collimator 112 with respect to each other.

The positioning system 122 then locates the substrate 106 and the shadow mask 108 at a first position such that a first series of deposition sites in deposition region 160 are aligned with apertures 180 of the shadow mask 108, while planes 140 and 190 are parallel and the separation, S, between the substrate and shadow mask may be as close to zero (i.e., in contact) as possible—preferably within a few microns (e.g., 1-5 microns). In some embodiments, S may include another suitable separation distance.

The source 116 generates a first vapor plume 170 of material 118 that propagates through the collimator 112, to generate a collimated vapor field 200 that subsequently propagates through the apertures 180 of the shadow mask 108 as a deposition particle beams 210 onto each respective first deposition site within the deposition region 160 as defined by the first position of the shadow mask 108 with respect to the substrate 106. The deposition material 118 of the source 116 may be deposited to a first height or thickness on the substrate based on the type of deposition material, the time of the deposition process or any other number of factors to produce a desired first height or thickness of the deposition material 118.

The positioning system 122 then locates the substrate 106 and the shadow mask 108 at a second position such that second series of deposition sites in deposition region 160 are aligned with the same apertures 180 of the shadow mask 108, while planes 140 and 190 are parallel and the separation, S, between the substrate and shadow mask may be as close to zero (i.e., in contact) as possible—preferably within a few microns (e.g., 1-5 microns). In some embodiments, S may include another suitable separation distance for this second operation.

In one embodiment, the source 116 may generate a second vapor plume 170 of the same deposition material 118 that propagates through the collimator 112, to generate a collimated vapor field 200 that subsequently propagates through the same apertures 180 of the shadow mask 108 as deposition particle beams 210 onto each respective second deposition site within the deposition region 160 as defined by the second position of the shadow mask 108 with respect to the substrate 106. The same deposition material 118 of the source 116 may be deposited to a first height or thickness on the substrate based on the type of deposition material, the time of the deposition process or any other number of factors to produce a desired second height or thickness of the deposition material 118. In one embodiment, the second height or thickness of the deposition material 118 may be the same height or thickness of the deposition material at the first position. In an alternative embodiment, the second height or thickness of the deposition material 118 may be a different height or thickness of the deposition material than the height or thickness of the deposition material at the first position.

The source 116 may include a first type of inorganic metal material suitable for anode fabrication on the substrate 106. These materials may include, but are not limited to Indium Tin Oxide (ITO), Aluminum (Al), Zinc Oxide (ZnO), Aluminum doped Zinc Oxide (AZO), etc.

In an alternative embodiment, a second source 116b may be moved into position by the positioning system 122 to generate a vapor plume 170 of a different second deposition material 118b of a second source 116b that propagates through the collimator 112, to generate a collimated vapor field 200 that subsequently propagates through the same apertures 180 of the shadow mask 108 as deposition particle beams 210 onto each respective second deposition site within the deposition region 160 as defined by the second position of the shadow mask 108 with respect to the substrate 106. The second deposition material 118b of the second source 116 may be deposited to a first height or thickness on the substrate based on the type of deposition material, the time of the deposition process or any other number of factors to produce a desired second height or thickness of the deposition material 118. In one embodiment, the second height or thickness of the second deposition material 118b may be the same height or thickness of the deposition material at the first position. In an alternative embodiment, the second height or thickness of the second deposition material 118b may be a different height or thickness of the deposition material than the height or thickness of the deposition material at the first position.

The second source 116b may include a second type of inorganic metal material suitable for anode fabrication on the substrate 106. These materials may include, but are not limited to Molybdenum Oxide (MoO), Silver (Ag), etc.

Figure 4:
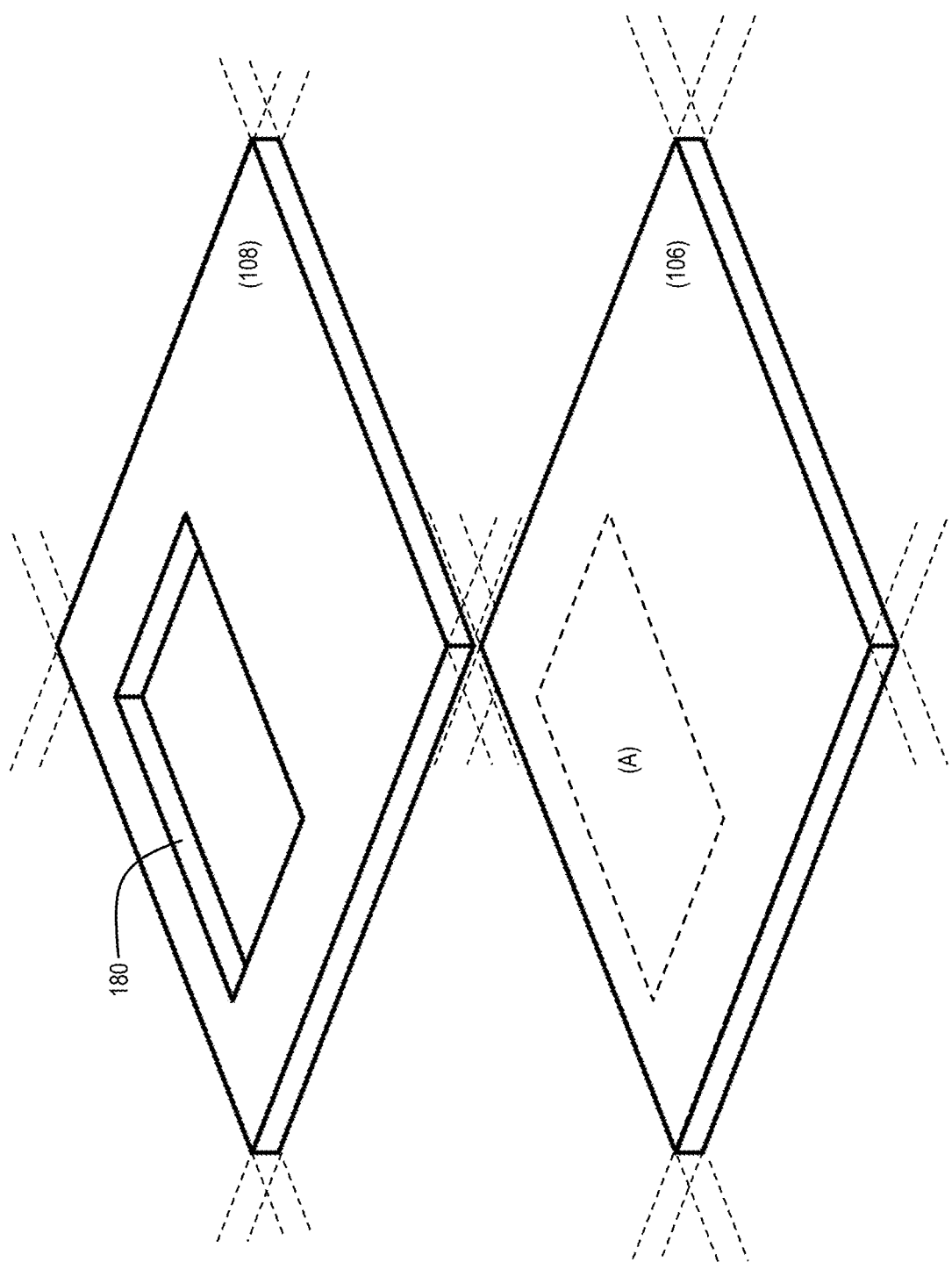
FIGS. 4-8 illustrate one method for depositing a directly patterned layer of material on a substrate in accordance with the illustrative embodiment.

FIG. 4 illustrates positioning a representative portion of a shadow mask 108 having an aperture 180 over a first deposition position A of a representative portion of a substrate 106.

Figure 5:
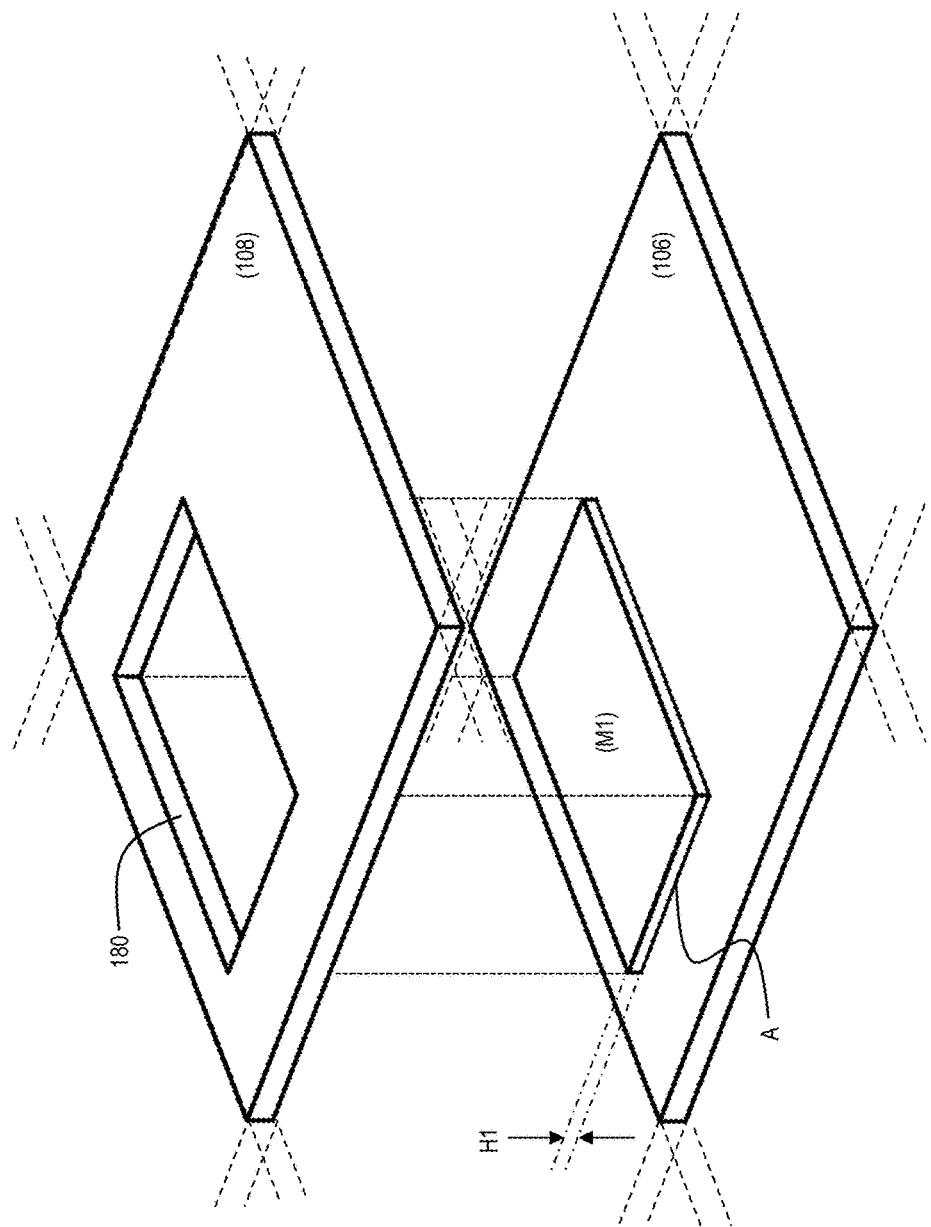

FIG. 5 illustrates depositing a first material M1 through the aperture 180 of the representative portion of the shadow mask 108 at the first deposition position A of the representative portion of the substrate 106 to a first height H1.

Figure 6:
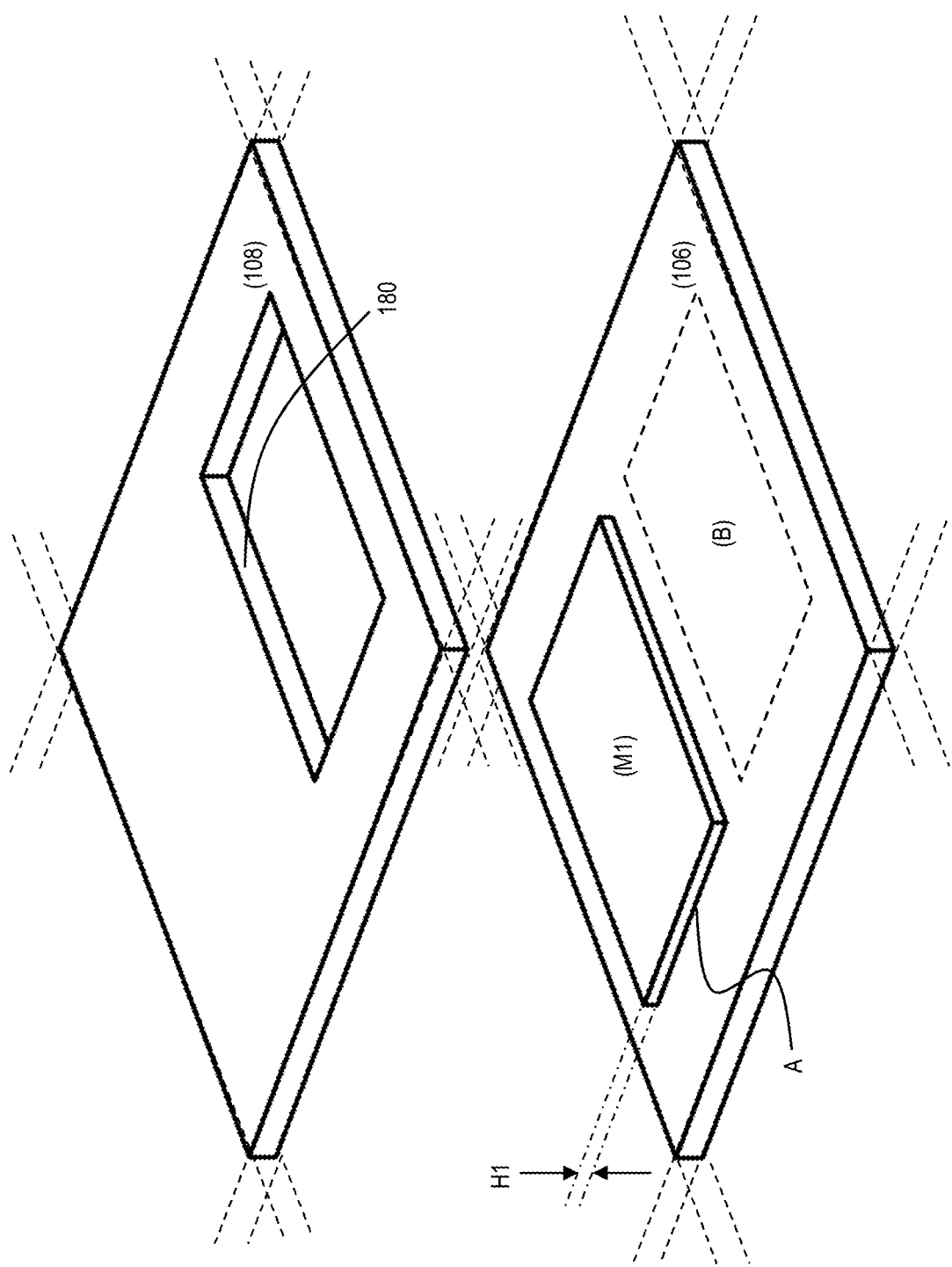

FIG. 6 illustrates positioning a representative portion of the shadow mask 108 having the same aperture 180 over a second deposition position B of the representative portion of a substrate 106.

Figure 7:
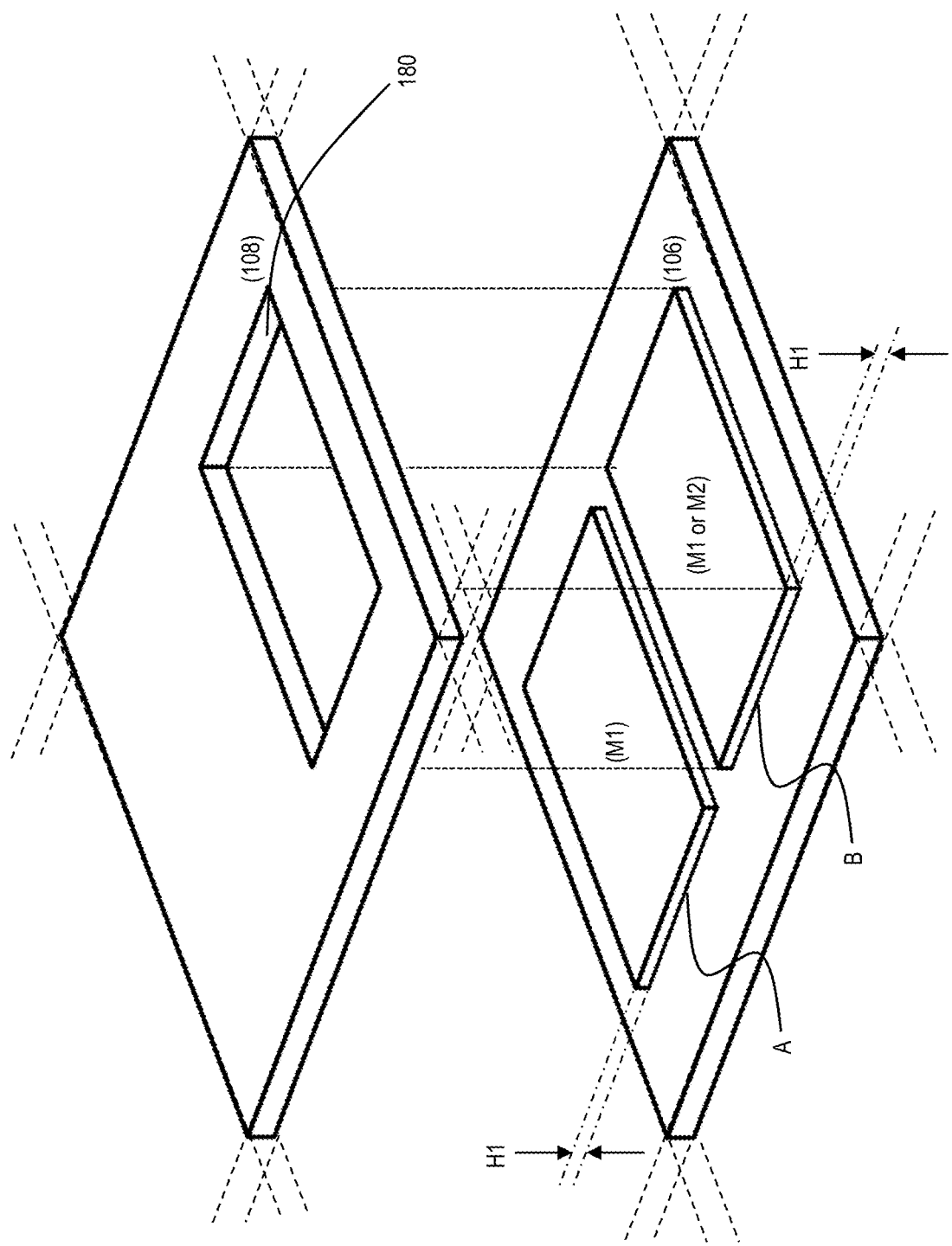

FIG. 7 illustrates depositing either the first material M1, or in the alternative, a second material M2 through the aperture 180 of the representative portion of the shadow mask 108 at the second deposition position B of the representative portion of the substrate 106 to the same first height H1.

Figure 8:
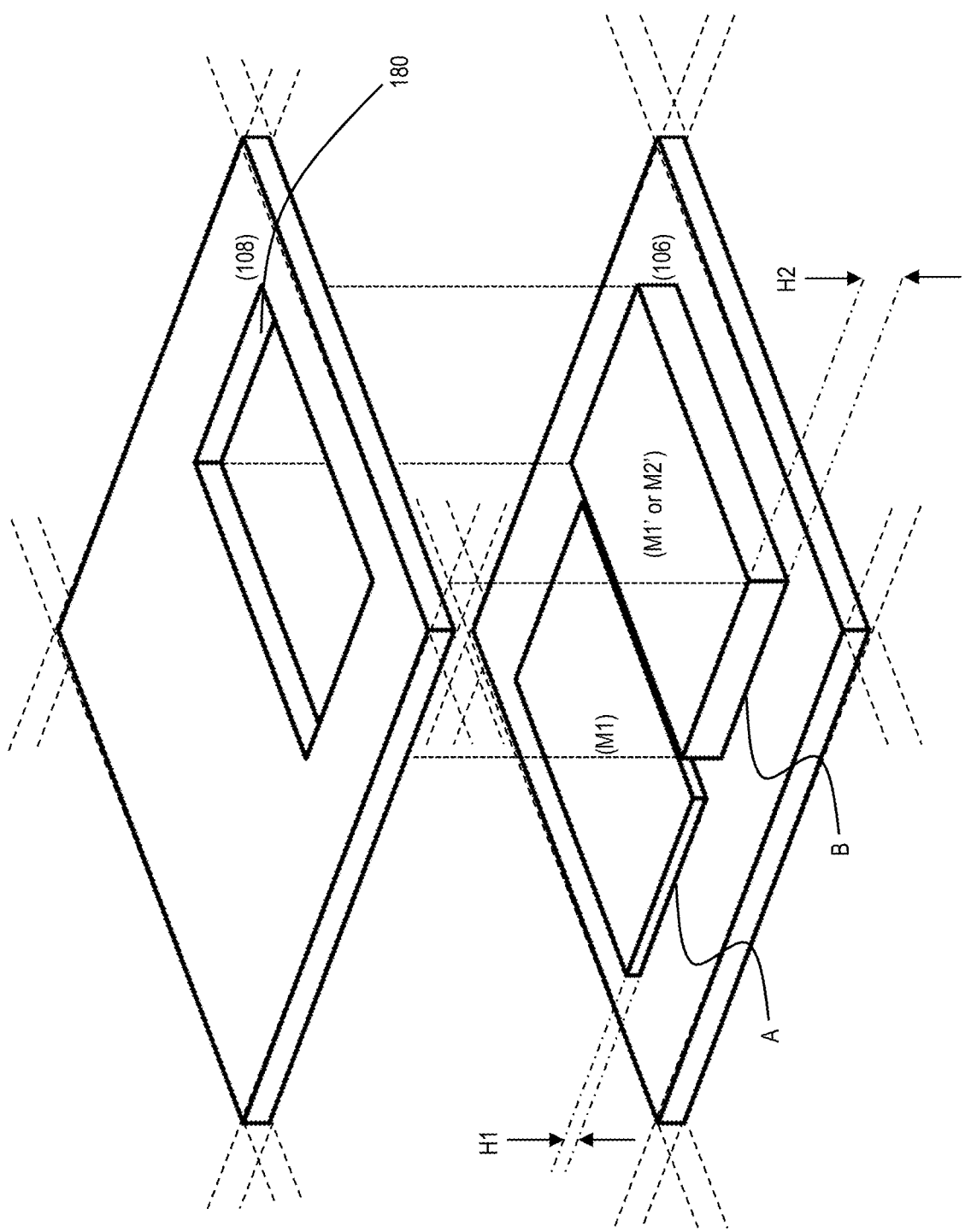

FIG. 8 presents an alternative embodiment to FIG. 7 that illustrates depositing either the first material M1', or in the alternative, the second material M2' through the aperture 180 of the representative portion of the shadow mask 108 at the second deposition position B of the representative portion of the substrate 106 to a different second height H2 than the first height H1. FIG. 8 illustrates the H2 being greater than H1, but in an alternative embodiment, H2 may be less than H1.

FIGS. 9-13 illustrate one method for depositing a directly patterned layer of material on either an anode element, an OLED sub-pixel element or a cathode element in accordance with the illustrative embodiment.

A second illustrative method includes mounting the shadow mask 108 to the mask chuck 110 and mounting the substrate 106 in substrate chuck 104 where the substrate 106 may already have either 1) the inorganic metal anode material, organic OLED material or inorganic metal cathode material deposited thereupon. The positioning system 122 then controls the relative positions of the substrate 106 and its corresponding deposited material, the shadow mask 108, and the collimator 112 with respect to each other.

The positioning system 122 then locates the substrate 106 with the corresponding deposited material and the shadow mask 108 at a first position such that a first series of deposition sites in deposition region 160 are aligned with apertures 180 of the shadow mask 108, while planes 140 and 190 are parallel and the separation, S, between the substrate with the corresponding deposited material and shadow mask may be as close to zero (i.e., in contact) as possible—preferably within a few microns (e.g., 1-5 microns). In some embodiments, S may include another suitable separation distance.

The source 116 generates a first vapor plume 170 of material 118 that propagates through the collimator 112, to generate a collimated vapor field 200 that subsequently propagates through the same apertures 180 of the shadow mask 108 as deposition particle beams 210 onto each respective first deposition site within the deposition region 160 as defined by the first position of the shadow mask 108 with respect to the substrate 106.

The source 116 and the material 118 in this second illustrative embodiment may correspond to either 1) an organic OLED material to be deposed over an existing metal anode material layer, 2) an inorganic metal cathode material to be deposited over an existing OLED material layer, or 3) a color wavelength modifier material (e.g., a color filter or quantum dot material) to be deposited over the OLED material layer or the cathode layer.

The deposition material 118 of the source 116 may be deposited to a first height or thickness on the one of 1) the inorganic metal anode material, 2) the organic OLED material, or 3) the metal cathode material based on the type of deposition material, the time of the deposition process or any other number of factors to produce a desired first height or thickness of the deposition material 118.

The positioning system 122 then locates the substrate 106 and the shadow mask 108 at a second position such that second series of deposition sites in deposition region 160 are aligned with the same apertures 180 of the shadow mask 108, while planes 140 and 190 are parallel and the separation, S, between the substrate and shadow mask may be as close to zero (i.e., in contact) as possible—preferably within a few microns (e.g., 1-5 microns). In some embodiments, S may include another suitable separation distance for this second operation.

In one embodiment, the source 116 may generate a second vapor plume 170 of the same deposition material 118 that propagates through the collimator 112, to generate a collimated vapor field 200 that subsequently propagates through the same apertures 180 of the shadow mask 108 as deposition particle beams 210 onto each respective second deposition site within the deposition region 160 as defined by the second position of the shadow mask 108 with respect to one of 1) the inorganic metal anode material, 2) the organic OLED material, or 3) the metal cathode material. The same deposition material 118 of the source 116 may be deposited to a first height or thickness on the substrate based on the type of deposition material, the time of the deposition process or any other number of factors to produce a desired second height or thickness of the deposition material 118. In one embodiment, the second height or thickness of the deposition material 118 may be the same height or thickness of the deposition material at the first position. In an alternative embodiment, the second height or thickness of the deposition material 118 may be a different height or thickness of the deposition material than the height or thickness of the deposition material at the first position.

The source 116 in the second illustrative embodiment may include a first type of organic OLED material, inorganic metal material suitable for cathode fabrication or color filter and/or quantum dot material. These materials may include, but are not limited to Tris(8-hydroxyquinolinato)aluminum (AlQ3), Magnesium (Mg), Silver (Ag), Lithium Fluoride (LiF), etc.

In an alternative embodiment, a second source 116b may be moved into position by the positioning system 122 to generate a vapor plume 170 of a different second deposition material 118b of a second source 116b that propagates through the collimator 112, to generate a collimated vapor field 200 that subsequently propagates through the same apertures 180 of the shadow mask 108 as deposition particle beams 210 onto each respective second deposition site within the deposition region 160 as defined by the second position of the shadow mask 108 with respect to one of 1) the inorganic metal anode material, 2) the organic OLED material, or 3) the metal cathode material. The second deposition material 118b of the second source 116 may be deposited to a first height or thickness on the substrate based on the type of deposition material, the time of the deposition process or any other number of factors to produce a desired second height or thickness of the deposition material 118. In one embodiment, the second height or thickness of the second deposition material 118b may be the same height or thickness of the deposition material at the first position. In an alternative embodiment, the second height or thickness of the second deposition material 118b may be a different height or thickness of the deposition material than the height or thickness of the deposition material at the first position.

The second source 116b may include a second type of organic OLED material, inorganic metal material suitable for cathode fabrication or color filter and/or quantum dot material. These materials may include, but are not limited to Tris(8-hydroxyquinolinato)aluminum (AlQ3), Magnesium (Mg), Silver (Ag), Lithium Fluoride (LiF), etc.

Figure 9:
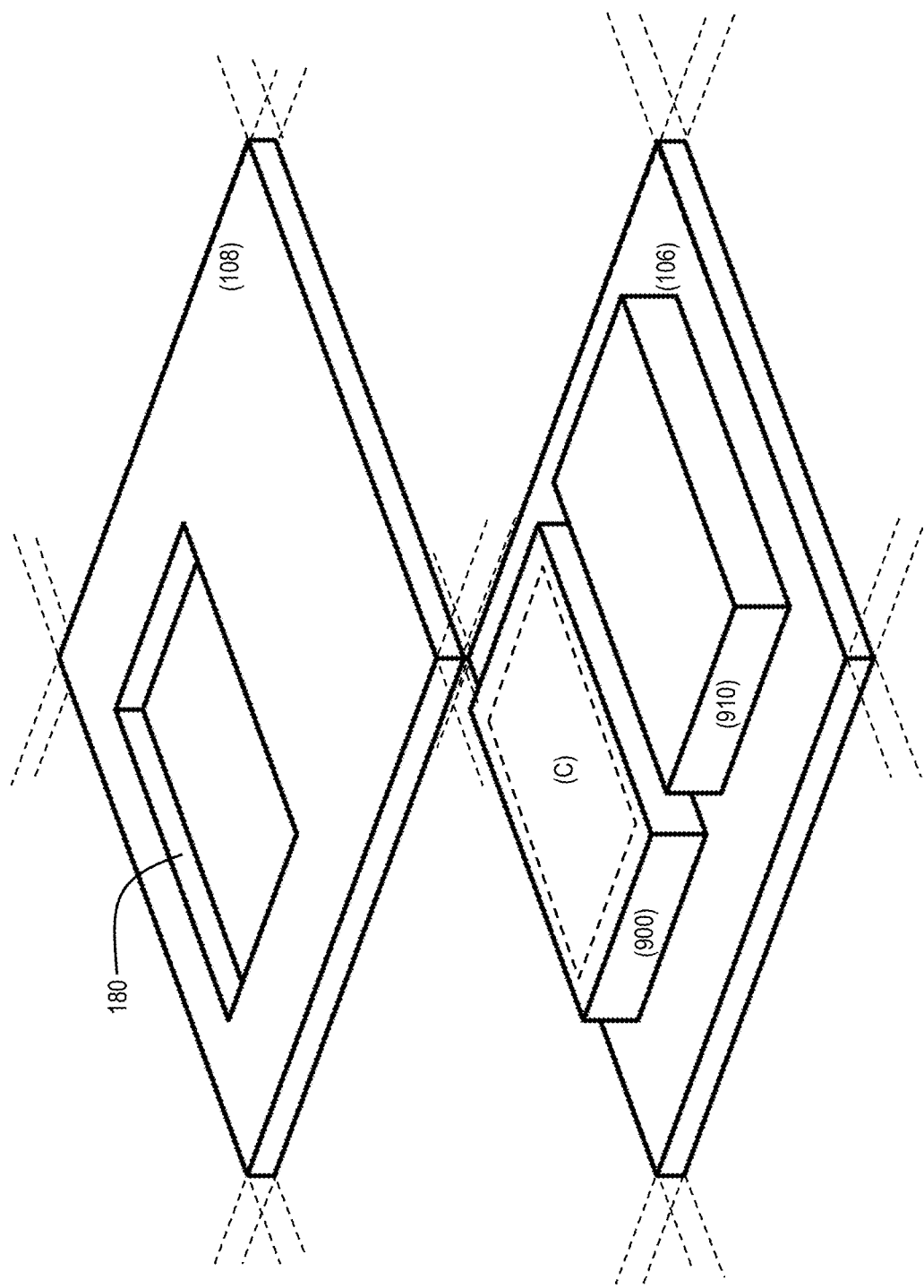
FIGS. 9-13 illustrate one method for depositing a directly patterned layer of material on either an anode element, an OLED sub-pixel element or a cathode element in accordance with the illustrative embodiment.

FIG. 9 illustrates positioning a representative portion of a shadow mask 108 having an aperture 180 over a first deposition position C of a representative portion of one of 1) the inorganic metal anode material, 2) the organic OLED material, or 3) the metal cathode material 900 at position C.

Figure 10:
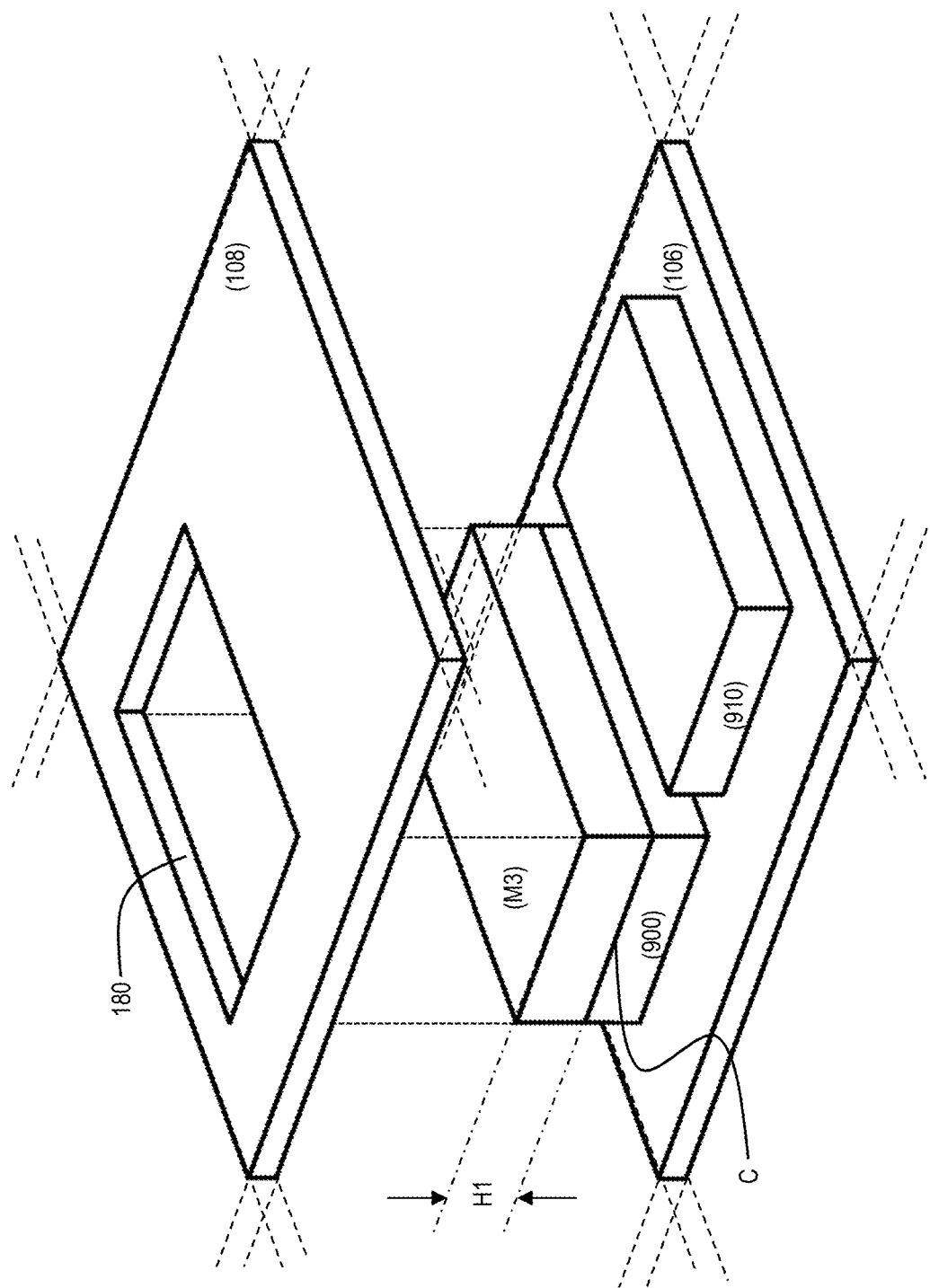

FIG. 10 illustrates depositing a first material M3 through the aperture 180 of the representative portion of the shadow mask 108 at the first deposition position C of the representative portion of 1) the inorganic metal anode material, 2) the organic OLED material, or 3) the metal cathode material 900 to a first height H1.

Figure 11:
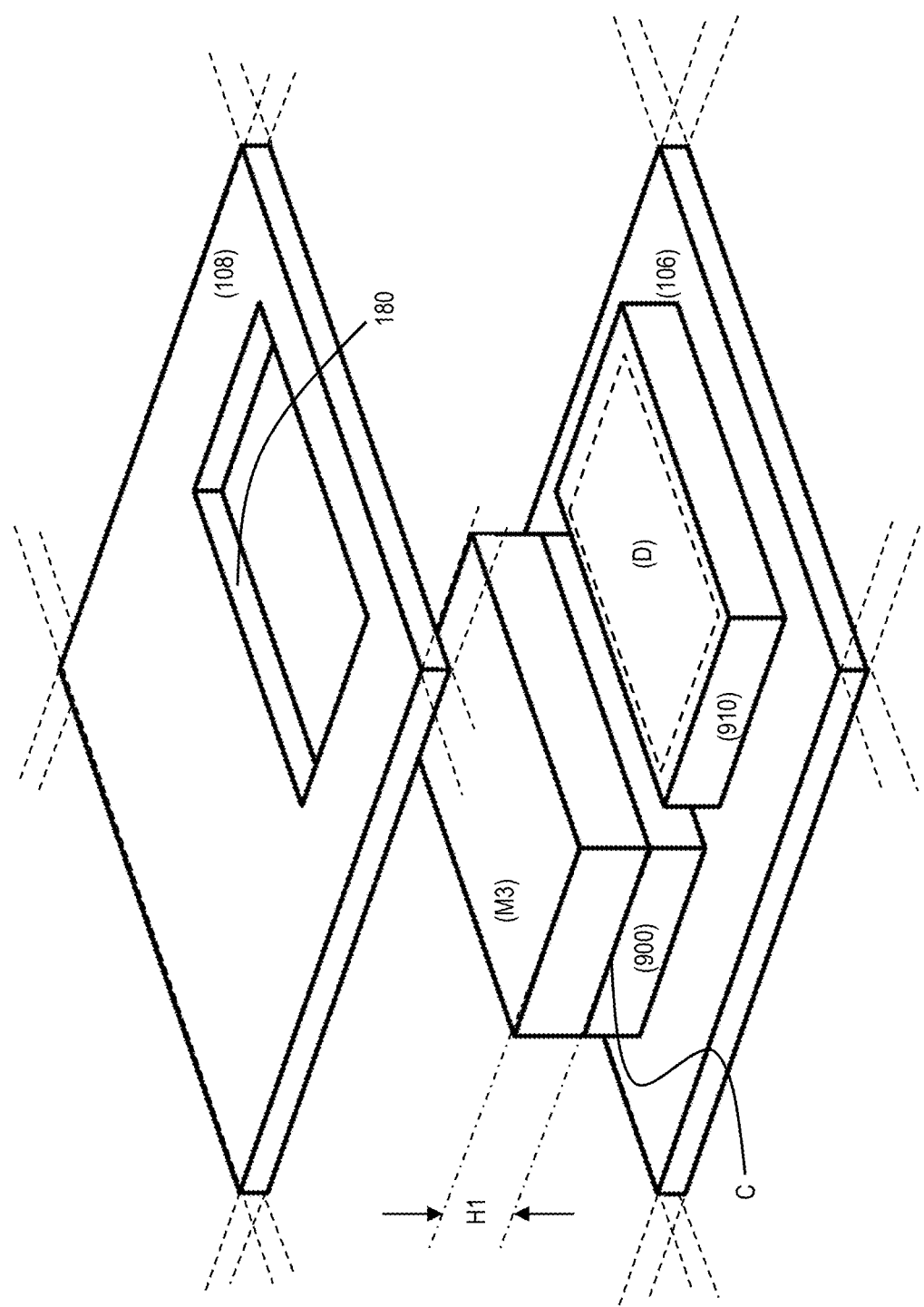

FIG. 11 illustrates positioning a representative portion of the shadow mask 108 having the same aperture 180 over a second deposition position D of the representative portion of one of 1) the inorganic metal anode material, 2) the organic OLED material, or 3) the metal cathode material 910 at position D.

Figure 12:
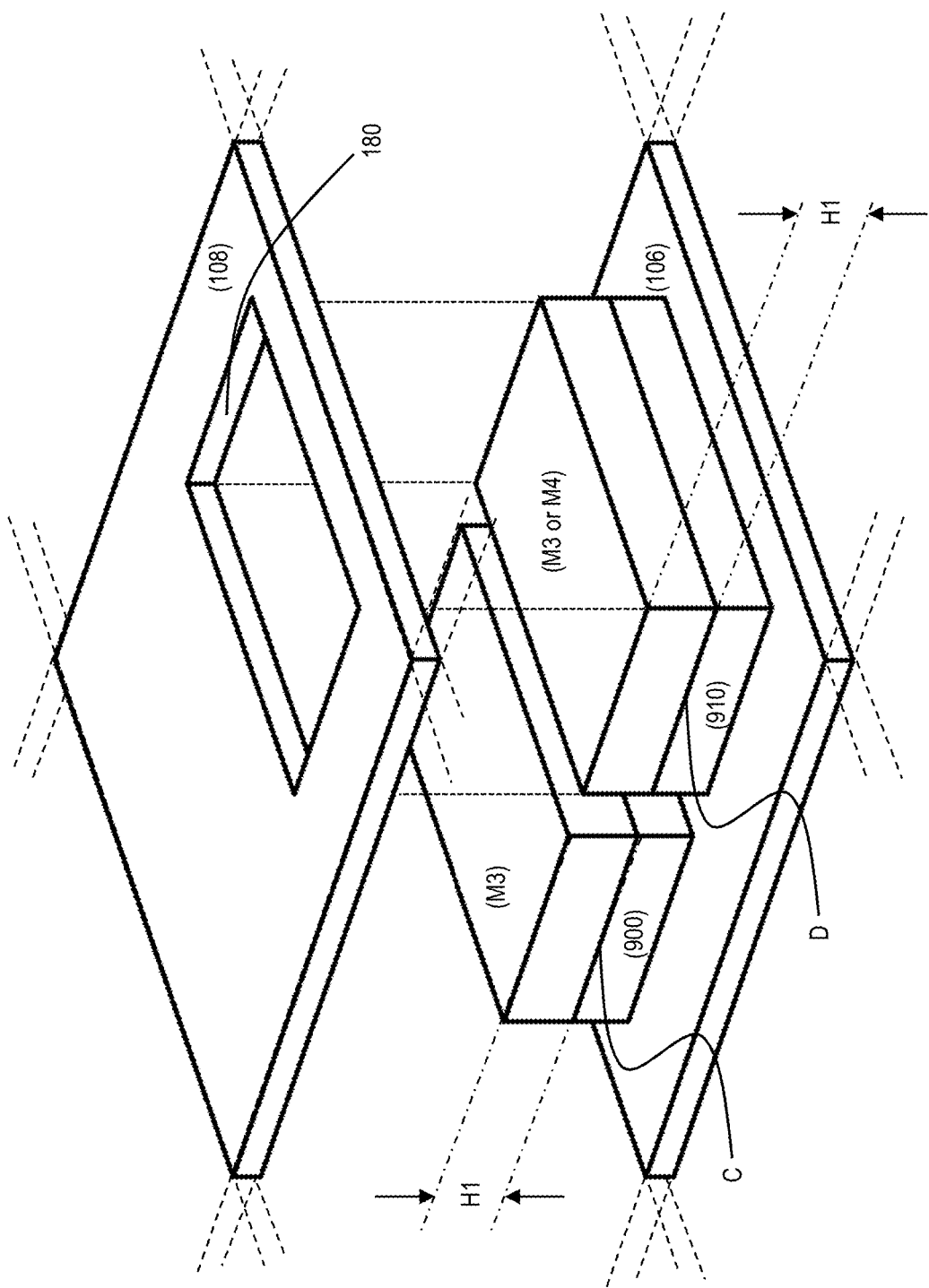

FIG. 12 illustrates depositing either the first material M3, or in the alternative, a second material M4 through the aperture 180 of the representative portion of the shadow mask 108 at the second deposition position D of the representative portion of one of 1) the inorganic metal anode material, 2) the organic OLED material, or 3) the metal cathode material 910 to the same first height H1.

Figure 13:
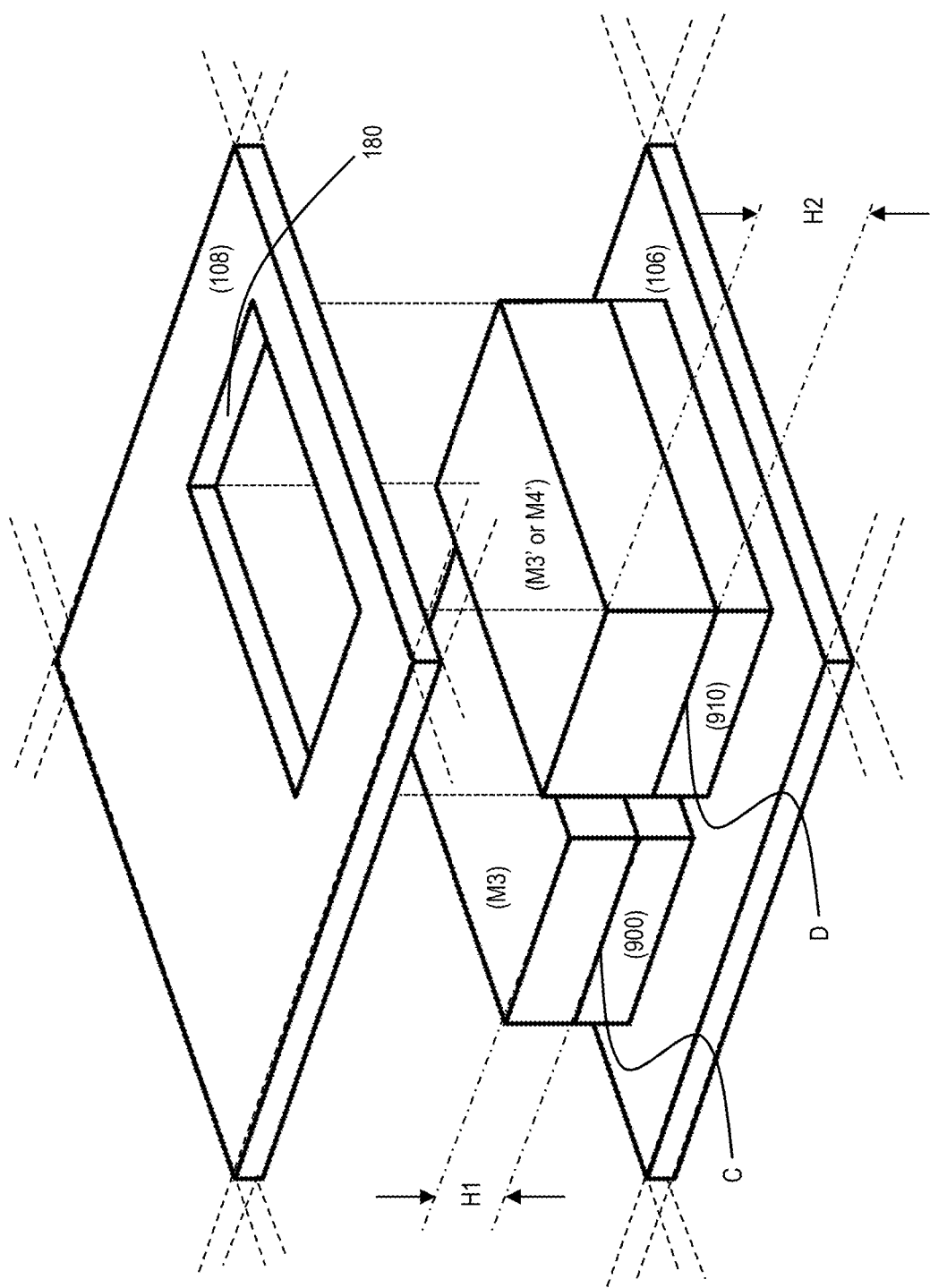

FIG. 13 presents an alternative embodiment to FIG. 12 that illustrates depositing either the first material M3', or in the alternative, the second material M4' through the aperture 180 of the representative portion of the shadow mask 108 at the second deposition position D of the representative portion of one of 1) the inorganic metal anode material, 2) the organic OLED material, or 3) the metal cathode material 910 to a different second height H2 than the first height H1. FIG. 13 illustrates the H2 being greater than H1, but in an alternative embodiment, H2 may be less than H1.

In summary, an illustrative method for performing material deposition on an active-matrix organic light emitting diode (AMOLED) display array on a substrate, may comprise: aligning a shadow mask to a first position relative to the substrate, the first position corresponding to a first sub-pixel of an AMOLED display pixel; initially depositing a first material through the shadow mask onto the substrate at a first material deposition position relative to the first position of the aligned shadow mask and at a first deposition height; incrementing the position of the shadow mask to a second position relative to the first material deposition position, the second position corresponding to a second corresponding sub-pixel of the AMOLED display pixel; and subsequently depositing one of the first material or a second material through the shadow mask onto the substrate at a second material deposition position relative to the first material deposition position.

The method may further include: re-aligning the shadow mask to the first position and depositing a third material through the shadow mask on top of the first material; re-aligning the shadow mask to the second position and depositing a fourth material through the shadow mask on top of the second material; re-aligning the shadow mask to the first position and depositing a fifth material through the shadow mask on top of the third material; and re-aligning the shadow mask to the second position and depositing a sixth material through the shadow mask on top of the forth material, wherein each subsequent material deposition position having an identical deposition pattern as the first material deposition position on account of the shadow mask.

The method may further include wherein the first and second material comprises one of a metal anode or cathode material, wherein the third and fourth material comprises organic OLED emitter material, and wherein the fifth and sixth material comprises one of the other of the metal cathode or anode material.

The method may further include wherein the fifth and sixth material comprises a color wavelength modifier material over a first and a second sub-pixel, the color wavelength modifier material including one of a color filter material or a quantum dot material.

The method may further comprise wherein subsequently depositing one of the first material or the second material through the shadow mask onto the substrate further comprises: subsequently depositing the first material through the shadow mask onto the substrate at the second material deposition position at a second deposition height, wherein the second deposition height being different than the first deposition height.

The method may further comprise wherein subsequently depositing one of the first material or the second material through the shadow mask onto the substrate further comprises: subsequently depositing the second material through the shadow mask onto the substrate at the second material deposition position.

The method may further comprise wherein subsequently depositing the second material through the shadow mask onto the substrate at the second material deposition position further comprises: depositing the second material at the first deposition height.

The method may further comprise wherein subsequently depositing the second material through the shadow mask onto the substrate at the second material deposition position further comprises: depositing the second material at a second deposition height, wherein the second deposition height being different than the first deposition height, wherein the second material comprises one of: metal anode or cathode material; organic OLED emitter material; or color wavelength modifier material comprising one of: a color filter material; or a quantum dot material.

An illustrative apparatus fabricated by the above illustrative methods may comprise an active matrix organic light emitting diode (AMOLED) array comprising a plurality of pixels, wherein each pixel comprises: a metal anode layer having at least a first anode comprising a first metal material at a first anode material height; and an organic light emitter layer having at least a first single-color light emitter element comprising a first organic material at a first light emitter material height.

The AMOLED array may further comprise wherein the metal anode layer further comprises: a second anode comprising the first metal material at a second anode material height, the second anode material height being different from the first anode material height, and the second anode having an identical deposition pattern as the first anode.

The AMOLED array may further comprise wherein the metal anode layer further comprises: a second anode comprising a second metal material at the first anode material height, and the second anode having an identical deposition pattern as the first anode.

The AMOLED array may further comprise wherein the metal anode layer further comprises: a second anode comprising a second metal material at a second anode material height, the second anode material height being different from the first anode material height, and the second anode having an identical deposition pattern as the first anode.

The AMOLED array may further comprise wherein the organic light emitter layer further comprises: a second single-color light emitter element comprising the first organic material at a second light emitter material height, the second light emitter material height being different from the first light emitter material height, and the second single-color light emitter element having an identical deposition pattern as the first single-color light emitter element.

The AMOLED array may further comprise wherein the organic light emitter layer further comprises: a second single-color light emitter element comprising a second organic material at the first light emitter material height, and the second single-color light emitter element having an identical deposition pattern as the first single-color light emitter element.

The AMOLED array may further comprise wherein the organic light emitter layer further comprises: a second single-color light emitter element comprising a second organic light emitter material at a second light emitter material height, the second light emitter material height being different from the first light emitter material height, and the second single-color light emitter element having an identical deposition pattern as the first single-color light emitter element.

The AMOLED array may further comprise a color wavelength modifier layer having at least a first modifier element comprising a first color wavelength modifier material at a first modifier element material height, wherein the first color wavelength modifier material comprises at least one of: a color filter, or a quantum dot material.

The AMOLED array may further comprise wherein the color wavelength modifier layer further comprises: a second modifier element comprising the first color wavelength modifier material at a second modifier element material height, the second modifier element material height being different from the first modifier element material height, the second modifier element having an identical deposition pattern as the first modifier element.

The AMOLED array may further comprise wherein the color wavelength modifier layer further comprises: a second modifier element comprising a second color wavelength modifier material at the first modifier element material height, the second modifier element having an identical deposition pattern as the first modifier element, and wherein the second color wavelength modifier material comprises at least one of: a color filter, or a quantum dot material.

The AMOLED array may further comprise wherein the color wavelength modifier layer further comprises: a second modifier element comprising a second color wavelength modifier material at a second modifier element material height, the second modifier element material height being different from the first modifier element material height, the second modifier element having an identical deposition pattern as the first modifier element, and wherein the second color wavelength modifier material comprises at least one of: a color filter, or a quantum dot material.

Summary of the Illustrative Embodiments

The present illustrative embodiments are for system of directly patterning a charge injecting pixel array with pixel sizes of less than 10 microns using vacuum deposition techniques through a high-resolution shadow mask.

In a second illustrative embodiment, the present invention may be a system for directly patterning a charge injecting pixel array with pixel sizes of less than 10 microns using vacuum deposition techniques through a high-resolution shadow mask in which different materials can be used in different regions of the pixel array.

In a third illustrative embodiment, the present invention may be a system for directly patterning an entire active matrix OLED display, including anode, a plurality of organic layers and cathode, with pixel sizes of less than 10 microns through a high-resolution shadow mask without exposure to air, chemicals or etches in which each deposited material may be varied by composition and thickness by region on the display.

In a fourth illustrative embodiment, the present invention may be an organic light emitting diode display in which the patterned charge injecting pixel array may possess a different metallic composition for the red, green and blue regions of the pixel array.

It is to be understood that the disclosure teaches just some embodiments in accordance with the present invention and that many variations of the invention can easily be devised by those skilled in the art after reading this disclosure and that the scope of the present invention is to be determined by the following claims.

What is claimed is:

1. A method for performing material deposition on an active-matrix organic light emitting diode (AMOLED) display array on a substrate, the method comprising:

aligning a shadow mask to a first position relative to the substrate, the first position corresponding to a first sub-pixel of an AMOLED display pixel;

initially depositing a first material through the shadow mask onto the substrate at a first material deposition position relative to the first position of the aligned shadow mask and at a first deposition height relative to the substrate;

incrementing the position of the shadow mask to a second position relative to the first material deposition position, the second position corresponding to a second corresponding sub-pixel of the AMOLED display pixel;

subsequently depositing one of the first material or a second material through the shadow mask onto the substrate at a second material deposition position relative to the first material deposition position;

re-aligning the shadow mask to the first position and depositing a third material through the shadow mask on top of the first material;

re-aligning the shadow mask to the second position and depositing a fourth material through the shadow mask on top of the second material;

re-aligning the shadow mask to the first position and depositing a fifth material through the shadow mask on top of the third material; and re-aligning the shadow mask to the second position and depositing a sixth material through the shadow mask on top of the fourth material, wherein each subsequent material deposition position has an identical deposition pattern as the first material deposition position on account of the shadow mask.

2. The method according to claim 1, wherein the first and second material comprises one of a metal anode or cathode material, wherein the third and fourth material comprises organic OLED emitter material, and wherein the fifth and sixth material comprises one of the other of the metal cathode or anode material.

3. The method according to claim 1, wherein the fifth and sixth material comprises a color wavelength modifier material over a first and a second sub-pixel, the color wavelength modifier material including one of a color filter material or a quantum dot material.

4. The method according to claim 1, wherein subsequently depositing one of the first material or the second material through the shadow mask onto the substrate further comprises:

subsequently depositing the first material through the shadow mask onto the substrate at the second material deposition position at a second deposition height, wherein the second deposition height relative to the substrate is different than the first deposition height relative to the substrate.

5. The method according to claim 1, wherein subsequently depositing one of the first material or the second material through the shadow mask onto the substrate further comprises:

subsequently depositing the second material through the shadow mask onto the substrate at the second material deposition position.

6. The method according to claim 5, wherein subsequently depositing the second material through the shadow mask onto the substrate at the second material deposition position further comprises:

depositing the second material at the first deposition height relative to the substrate.

7. The method according to claim 5, wherein subsequently depositing the second material through the shadow mask onto the substrate at the second material deposition position further comprises:

depositing the second material at a second deposition height relative to the substrate, wherein the second deposition height relative to the substrate is different than the first deposition height relative to the substrate.

8. The method according to claim 5, wherein the second material comprises one of:
metal anode or cathode material;
organic OLED emitter material; or
color wavelength modifier material.

9. The method according to claim 8, wherein the color wavelength modifier material comprises one of:
a color filter material; or
a quantum dot material.

10. An active matrix organic light emitting diode (AMOLED) array comprising a plurality of pixels, wherein each pixel comprises a metal anode layer that includes:
a first anode comprising a first metal material at a first anode material height;
an organic light emitter layer having at least a first single-color light emitter element comprising a first organic material at a first light emitter material height; and
a second anode comprising the first metal material at a second anode material height, the second anode material height being different from the first anode material height;
wherein the first anode and the second anode have the same deposition pattern.

11. The AMOLED array according to claim 10 further comprising a color wavelength modifier layer having at least a first modifier element comprising a first color wavelength modifier material at a first modifier element material height, wherein the first color wavelength modifier material comprises a quantum dot material.

12. The AMOLED array according to claim 10, wherein the organic light emitter layer further comprises:
a second single-color light emitter element comprising the first organic material at a second light emitter material height,
the second light emitter material height being different from the first light emitter material height, and
the second single-color light emitter element having an identical deposition pattern as the first single-color light emitter element.

13. The AMOLED array according to claim 10, wherein the organic light emitter layer further comprises:
a second single-color light emitter element comprising a second organic material at the first light emitter material height, and
the second single-color light emitter element having an identical deposition pattern as the first single-color light emitter element.

14. The AMOLED array according to claim 10, wherein the organic light emitter layer further comprises:
a second single-color light emitter element comprising a second organic light emitter material at a second light emitter material height,
the second light emitter material height being different from the first light emitter material height, and
the second single-color light emitter element having an identical deposition pattern as the first single-color light emitter element.

15. The AMOLED array according to claim 10, further comprising:
a color wavelength modifier layer having at least a first modifier element comprising a first color wavelength modifier material at a first modifier element material height,
wherein the first color wavelength modifier material comprises at least one of:
color filter, or
quantum dot material.

16. The AMOLED array according to claim 15, wherein the color wavelength modifier layer further comprises:
a second modifier element comprising the first color wavelength modifier material at a second modifier element material height,
the second modifier element material height being different from the first modifier element material height,
the second modifier element having an identical deposition pattern as the first modifier element.

17. The AMOLED array according to claim 15, wherein the color wavelength modifier layer further comprises:
a second modifier element comprising a second color wavelength modifier material at the first modifier element material height,
the second modifier element having an identical deposition pattern as the first modifier element, and
wherein the second color wavelength modifier material comprises at least one of:
a color filter, or
a quantum dot material.

18. The AMOLED array according to claim 15, wherein the color wavelength modifier layer further comprises:
a second modifier element comprising a second color wavelength modifier material at a second modifier element material height,
the second modifier element material height being different from the first modifier element material height,
the second modifier element having an identical deposition pattern as the first modifier element, and
wherein the second color wavelength modifier material comprises at least one of:
a color filter, or
a quantum dot material.

19. An active matrix organic light emitting diode (AMOLED) array comprising a plurality of pixels, wherein each pixel comprises a metal anode layer that includes:
a first anode comprising a first metal material at a first anode material height;
an organic light emitter layer having at least a first single-color light emitter element comprising a first organic material at a first light emitter material height; and
a second anode comprising a second metal material at the first anode material height; and
wherein the first anode and the second anode have the same deposition pattern.

20. An active matrix organic light emitting diode (AMOLED) array comprising a plurality of pixels, wherein each pixel comprises a metal anode layer that includes:
a first anode comprising a first metal material at a first anode material height;
an organic light emitter layer having at least a first single-color light emitter element comprising a first organic material at a first light emitter material height; and
a second anode comprising a second metal material at a second anode material height that is different from the first anode material height;
wherein the first anode and the second anode have the same deposition pattern.

* * * * *